United States Patent [19]

Schoolar

[11] 4,154,631

[45] May 15, 1979

[54] EQUILIBRIUM GROWTH TECHNIQUE FOR PREPARING $PbS_xSe_{1-x}$ EPILAYERS

[75] Inventor: Richard B. Schoolar, Silver Spring, Md.

[73] Assignee: The United States of America as represented by the Secretary of the Navy, Washington, D.C.

[21] Appl. No.: 801,431

[22] Filed: May 27, 1977

[51] Int. Cl.² .................. H01L 21/203; H01L 21/363
[52] U.S. Cl. ..................................... 148/175; 118/49; 136/89 TF; 148/1.5; 156/611; 156/612; 252/62.3 V; 357/30
[58] Field of Search ................. 148/1.5, 175; 156/611, 156/612; 357/30; 118/49; 427/87, 248; 136/89 TF; 252/62.3 V

[56] References Cited

U.S. PATENT DOCUMENTS

| | | | |
|---|---|---|---|
| 3,403,133 | 9/1968 | Fredrick et al. | 252/62.3 V |
| 3,716,424 | 2/1973 | Schoolar | 148/175 |
| 3,793,070 | 2/1974 | Schoolar | 148/175 X |
| 3,961,998 | 6/1976 | Scharnhorst et al. | 148/175 |
| 4,063,974 | 12/1977 | Fraas | 148/175 |

OTHER PUBLICATIONS

Bis et al., "Thick-Epitaxial Films of $Pb_{1-x}Sn_xTe$", J. Vac. Sci. & Tech., vol. 9, No. 1, 1972, pp. 226-230.
Beecham, D., "Cadmium/Sulfur Isothermal Source for CdS Deposition", Rev. Scientific Instr., vol. 41, No. 11, Nov. 1970, pp. 1054-1057.
Jensen et al., "Surface Charge ... $Pb_{1-y}Sn_ySe$ Epitaxial Films", J. Vac. Sci. & Technol., vol. 13, No. 4, Jul.-/Aug., 1976, pp. 920-925.
Holloway et al., "Epitaxial Growth of Lead Tin Telluride", J. Applied Physics, vol. 41, No. 8, Jul., 1970, pp. 3543-3544.
Bylander et al., "Lead Salt Epitaxial Films ... Bulk Properties", Proceedings of IEEE, Apr., 1965, pp. 395-396.
Farinre et al., "Preparation ... of $Pb_{1-x}Sn_xTe$ Epitaxial Films", J. Vac. Sci. Technol., vol. 7, 1970, pp. 121-126.
Bis, Richard F., "Electrical Properties of $Pb_xSn_{1-x}Te$ Alloys", Ibid., p. 126.

*Primary Examiner*—L. Dewayne Rutledge
*Assistant Examiner*—W. G. Saba
*Attorney, Agent, or Firm*—R. S. Sciascia; A. L. Branning; R. E. Bushnell

[57] ABSTRACT

A high temperature method for the preparation of single and multiple epitaxial layers of single-phase lead sulfide-selenide, $[Pb]_a[S_xSe_{1-x}]_{1-a}$ wherein x varies between one and zero, inclusive, and $a=0.500\pm0.003$, deposited upon substrates of barium fluoride, $BaF_2$, maintained in near thermodynamic equilibrium with concurrently sublimated lead alloy and chalcogenide sources. During preparation, the substrate is exposed to the vapor emanating from the single chimney of a two-zone, dual-chamber furnace, thereby providing an epilayer of uniform, and predetermined electrical and optical properties.

58 Claims, 21 Drawing Figures

EQUILIBRIUM GROWTH TECHNIQUE FOR PREPARING PbS$_x$Se$_{1-x}$ EPILAYERS

BACKGROUND OF THE INVENTION

This invention generally relates to a method of preparing epitaxial films for use as infrared detection devices, and more particularly, to lead chalcogenide epitaxial films suitable for photovoltaic applications. Additionally, this invention relates to a simplified method of controlling conductivity type and carrier concentration of the semiconductor material during epitaxial growth.

Thin-films of lead salt alloys have been investigated intensively recently with particular attention to their photovoltaic properties. Especial attention has been paid to their possible use as detectors of infrared radiation.

The exploration of vacuum deposition techniques is quite recent and, for the benefit to those who not be familiar with the pioneering efforts in this art, the following brief bibliography is made of record.

Preparation of Single-Crystal Films Of PbS, by R. B. Schoolar and J. N. Zemel, Journal of Applied Physics, Vol. 35, No. 6, (June, 1964), pp. 1848 to 1851.

Epitaxial Lead-Containing Photoconductive Materials, by R. B. Schoolar, H. R. Riedl, and J. P. Davis, U.S. Pat. No. 3,574,140, (April, 1971)

Method of Preparation of Lead Sulfide PN Junction Diodes, by R. B. Schoolar, U.S. Pat. No. 3,716,424, (February, 1973)

Method Of Varying The Carrier Concentration Of Lead-Tin Sulfide Epitaxial Films, by R. B. Schoolar, U.S. Pat. No. 3,793,070, (February, 1974).

Photoconductive PbSe Epitaxial Films, by R. B. Schoolar and R. J. Lowney, Journal of Vacuum Science Technology, Vol. 8, No. 1, (1971).

More recent efforts although originating from a different direction, include:

Properties Of PbS$_{1-x}$Se$_x$ Epilayers Deposited Onto PbS Substrates By Hot-Wall Epitaxy, by K. Duh and H. Preier, Journal of Vacuum Science Technology, pp 1360, (1975).

PbSe Heteropitaxy By The Hot Wall Technique, by K. Duh and H. Preier, Thin Solid Films, Vol. 27, pp 247, (1975).

Double Heterojunction PbS- PbS$_{1-x}$Se$_x$-PbS Laser Diodes With CW Operation Up To 96K, by H. Preier, M. Bleicher, W. Riedel, and H. Maier, Applied Physics Letters, Vol. 28, No. 11, (June, 1976).

PbTe and Pb$_{0.8}$Sn$_{0.2}$Te Epitaxial Films On Cleaved BaF$_2$ Substrates Prepared By A Modified Hot-Wall Technique, by T. Kasai, D. W. Bassett, and J. Hornung, Journal of Applied Physics, Vol. 47, (July, 1976).

Double-Heterostructure PbS-PbSe-PbS Lasers With CW Operation Up to 120K, by H. Preier, M. Bleicher, W. Riedel, and H. Maier, Journal Of Applied Physics, Vol. 47, (December, 1976).

Growth Of PbTe Films Under Near-Equilibrium, by A. Lopez-Otero, Journal of Applied Physics, Vol. 48, January, 1977).

It is well established that single crystal films of PbS, PbSe, and related compounds, hereinafter referred to as lead salt alloys, can be epitaxially grown on heated alkali halide substrates by vacuum evaporation. It is also known that the conductivity type of these semiconductors in bulk form can be controlled by regulating deviation from stoichiometry. Anion vacancies (lead) make these crystals P-type and cation vacancies make them N-type.

In the past, planar diodes of the lead salts have been produced through the use of various diffusion techniques. The low partial pressures of these materials during sublimation however, means that few collisions occur between their vapor molecules. In the absence of molecular collisions, a film prepared by concurrent sublimation of a set of materials according to the teachings of the present art, with the apparatus disclosed in the Schoolar U.S. Pat. No. 3,716,424 reference for example, would be of non-uniform conductivity, and of graded stoichiometry. An alternative process, exposing a lead compound film to the vapor of a dopant, would only provide a slight change in the conductivity of the film without an appreciable change in its composition. The spectral response of the exposed film would be equal to that of the undoped film.

In an early paper, published in volume 41 of the Journal of Applied Physics, at 3543, (1970), Henry Holloway stated that he used a vacuum deposition technique in which the alkali-halide substrate was maintained at 324° C. Subsequent efforts, (e.g., Properties Of PbS$_{1-x}$Se$_x$ Epilayers..., by K. Duh and H. Preier, supra) continued to maintain the substrate temperature at or near this value. More recent efforts to improve the elecrical properties of epilayer films prepared by vacuum deposition, such as the hot-wall-techniques (HWT), have emphasized purity of materials, cleanliness, and rate of epilayer growth while relying upon unnecessarily complex apparatus without providing device quality films. These efforts have uniformly failed to recognize the desirability of maintaining a near thermodynamic equilibrium at the growth surface of the film, and have therefore allowed the chalcogenide to re-evaporate from the growth surface.

SUMMARY OF THE INVENTION

A single-phase lead sulfide selenide, [Pb]$_a$[S$_x$Se$_{1-x}$]$_{1-a}$, epilayer, where x varies between zero and one, inclusive, and a=0.500±0.003, with predetermined electrical and optical properties is prepared by equilibrium growth technique (EGT). An alkali-halide substrate maintained in near thermodynamic equilibrium with the source charges, is exposed to the single chimney orifice of a two-zone, dual-chamber furnace in which a homogeneous vapor has been produced by concurrent sublimation of a lead alloy in one chamber and a measured amount of chalcogenide in an appendant chamber. Regulation of the composition of the lead alloy charge controls the energy gap and thus, the spectral response, of the sublimate. Regulation of the ratio between the metal alloy and chalcogenide vapors controls deviations from stoichiometry in the sublimate and thus, its conductivity type and carrier concentration. A substitution of materials allows single-phase, epilayers of Pb$_{1-y}$Sn$_y$Se, 0≦y≦1.0, to be prepared by this technique. By periodically varying the temperature of the chalcogenide in the appended furnace from below to, or above, its sublimation temperature, multiple planar junction films may be prepared as successive epilayers of the film will exhibit opposite type conductivities.

Accordingly, one object of the invention is to provide a method and an apparatus for epitaxially preparing thin-films of lead sulfide-selenide.

A second object of the invention is to provide a method and an apparatus for epitaxially preparing thin-films of lead tin selenide.

Another object of the invention is to provide a method and an apparatus for epitaxially growing thin-films of lead salt alloys.

Yet another object of the invention is to provide a method and an apparatus for controlling the stoichiometry of lead salt alloy films during growth.

Still another object of the invention is to provide a method and an apparatus for epitaxially growing lead salt alloy thin-films with predestined charge carrier concentrations.

Still yet another object of the invention is to provide a method and an apparatus for epitaxially growing a lead salt alloy thin-film in which the ratio of the salt to the alloying element in the deposit film is variable between zero and one, inclusive.

A further object of the invention is to provide a lead sulfide-selenide epitaxial film of quality sufficient for photovoltaic applications.

A yet further object of the invention is to provide a lead salt alloy epitaxial film having a composition tuned spectral response.

A still yet further object of the invention is to provide a lead chalcogenide thin-film of smooth stoichiometry, suitable for photovoltaic applications.

An additional object of the invention is to provide a lead chalcogenide thin-film of uniform conductivity, suitable for photovoltaic application.

Another object of the invention is to provide a lead sulfide-selenide photovoltaic detector suitable for room temperature operation.

BRIEF DESCRIPTION OF THE DRAWINGS

A more complete appreciation of this invention, and many of the attendant advantages thereof, will be readily appreciated as the same becomes better understood by reference to the following detailed description when considered in conjunction with the accompanying drawings in which like numbers indicate the same or similar components, wherein.

DETAILED DESCRIPTION

Figure 1:
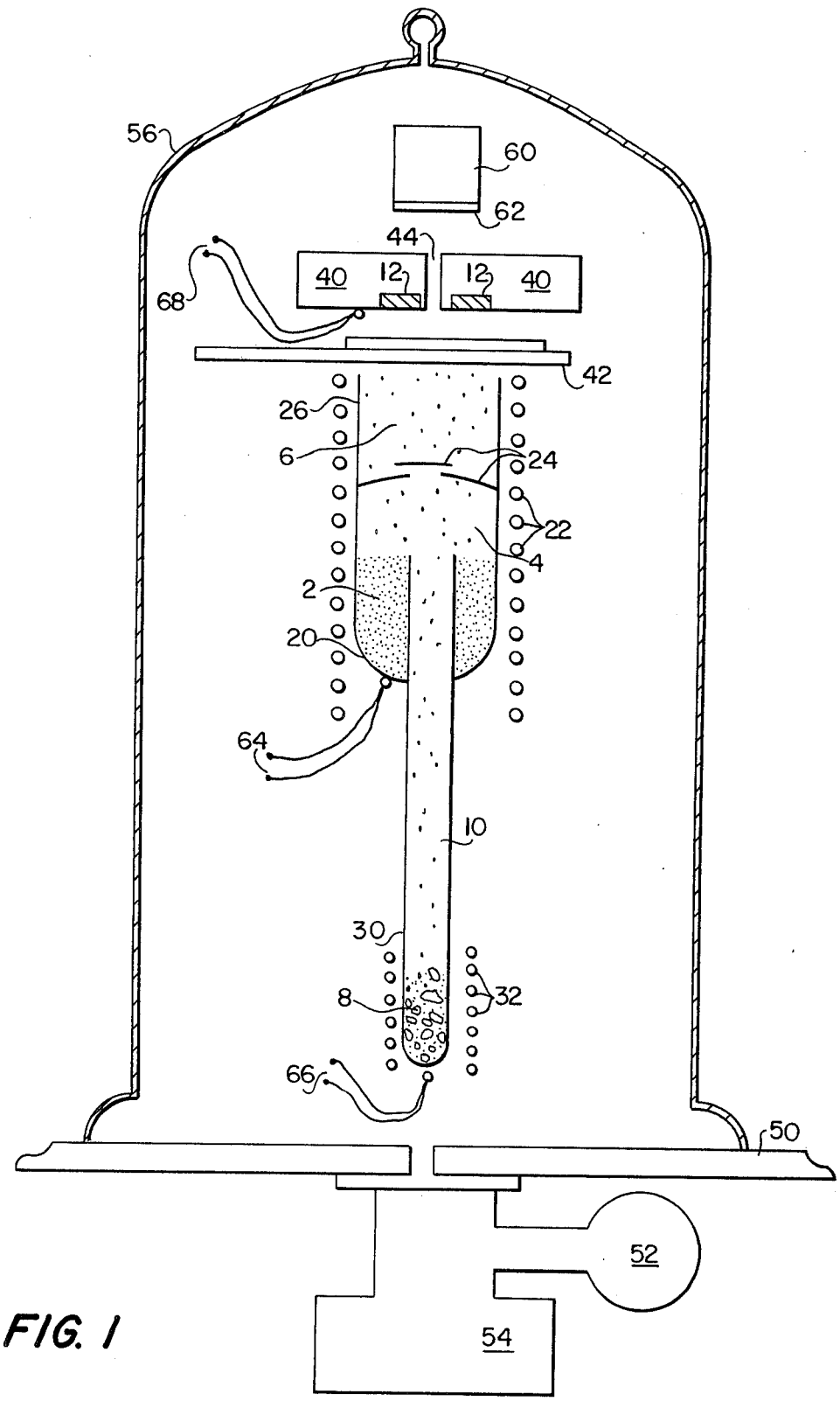
FIG. 1 is a cross-sectional diagram of a sublimation apparatus in which the process of this invention may be practiced.

Referring now to the drawings, and in particular to FIG. 1, there is shown a sectional view of a two-temperature zone vacuum deposition apparatus dedicated to the preparation of device quality epilayers of IV–VI compounds by equilibrium growth techniques. The apparatus shown is a conventional glass belljar system with a nitrogen cold trap and oil-diffusion pump 54, mounted upon a base 50. The central component of the apparatus illustrated is a two-zone, dual-chamber furnace known colloquially as an "insert." A vertical primary furnace 20, typically fabricated from quartz glass, discharges through its upper extremity into a single orifice chimney 26 of wider diameter. A smaller vertical, secondary furnace 30, also of quartz glass, known as a "cold tip", is formed by a coaxially appended (i.e., co-axially to assure a more uniform distribution of sublimate), blind tube extending through the bottom, and discharging into, above the contents, of primary furnace 20. A simple metal stand (not shown) holds the insert upright. During operation, the contents 2,8 of primary and secondary furnaces 20,30 are raised to, and maintained at a desired temperature by a pair of independently controlled, external thermal devices 22,32, shown helically coiled around the lower extremities of the primary and secondary furnaces 20,30. Typically, thermal device 22 is a heater, such as a nichrome wire coupled to a current regulated power supply. Conduction and radiant heating occurs between the primary and the upper third of the secondary furnace 20, 30. Depending upon the contents of secondary furnace 30, thermal device 32 may be either a heating coil like thermal coil 22, or a cooling coil. If the chalcogenide charge 8 is sulfur for example, thermal device 32 may be a short length of pipe or tube placed against base 50 and carrying tap water flowing at a rate sufficient to partially negate conduction heating and maintain the sulfur charge 8 at a lower temperature than the metal alloy charge 2 in the primary furnace 20. A glass baffle 24 located between opposite extremities in primary furnace 20, restricts the size of the molecules entering chimney 26.

Placed directly above chimney 26 are one or more substrate heaters 40, each of which raise to, and maintain at a desired temperature a retensively held substrate layer 12 with one face exposed to the orifice of chimney 26. A commercially available thickness monitor 60, space permitting, is located above a port 44 in substrate holder 40 so that its replaceable crystal face 62 is exposed to the sublimate passing through port 44. A mask and shutter mechanism 42 located between the orifice of chimney 26 and the exposed faces of substrate layers 12, is normally closed to prevent condensation of the charge materials when the furnaces are not at the proper temperatures. Thermocouples 64, 66, 68 monitor the temperature of source charge 2, chalcogenide 8, and substrates 12, respectively. An ion guage 52 is used to measure the vacuum inside chamber 36 below $10^{-3}$ Torr.

The metal alloy source material 2 is prepared by mixing weighted masses of the component elements, $[Pb]_a[S_xSe_{1-x}]_{1-a}$, $[Pb_{1-y}Sn_y]_a[Se]_{1-a}$, where a=0.500, in proportion to their atomic weight in the composition of the desired epilayer, heating the mixture in an evacuated chamber until it forms an all-reacted melt, and cooling the melt to room temperature. The resulting polycrystal is pulverized into course granules. The atomic fraction, a, is varied within ±0.003% of one-half of one percent to make the mixed mass either slightly metal or chalcogenide rich, as desired. A metal rich mixture, a>0.500, will produce a N-type conductivity epilayer in the absence of a compensating chalcogenide dopant 8, while a chalcogenide rich mixture, a<0.500, will produce a P-type conductivity epilayer.

Dopant 8 is a six nines (i.e., 99.9999%) pure chalcogenide (e.g., S, Se). The substrates 40 are freshly air-cleaved slices of a single crystal of an alkali halide such as $BaF_2$, $SrF_2$, or KBr. The bottom of primary furnace 20 is charged with perhaps twenty grams of the pulverized granules of a metal alloy 2, such as $[Pb]_a[S_xSe_{1-x}]$, where $0 \leq x \leq 1$. A twenty gram charge 2 is enough to prepare approximately twenty epilayers. The bottom of the cold tip, secondary furnace 30, is charged with perhaps one gram of chalcogenide dopant 8.

Prior to operation, freshly cleaved (111) insulating, crystalline substrates 12 are placed in substrate heater 40. Chamber 56 is evacuated to a pressure on the order of $10^{-6}$ Torr (i.e., approximately $1.3 \cdot 10^{-4}$ Pa), although only a vacuum better than $10^{-5}$ Torr is necessary. The temperature of substrates 12 is raised to, and maintained within, the 325° to 510° C. range. The atomic fraction of epilayer 14, x, is independent of the substrate temperature. The metal alloy charge 2 in primary furnace 20 is raised to between 550° and 650° C. and, is maintained within ± 5° C. of this range. The temperature of dopant charge 8, if the dopant is sulfur, is maintained at room temperature with a tolerance of +5° C. Prior to sublimation, a substrate temperature is empirically chosen to allow epitaxial growth, but with a minimum of defects. Changing the temperature of either, or both, metal alloy charge 2 or substrate 12 within their respective temperature ranges merely changes the rate of growth of the epilayer film 14 within a range between 2 and 20 microns per hour. The quality of the film is not sensitive to the rate of growth within these ranges; however, as is described below, the minority charge carrier lifetime of the epilayer is increased by keeping the substrate temperature raised during its growth. The thickness of the films grown may be varied from approximately two hundred angstroms to well beyond one micron.

Figure 2:
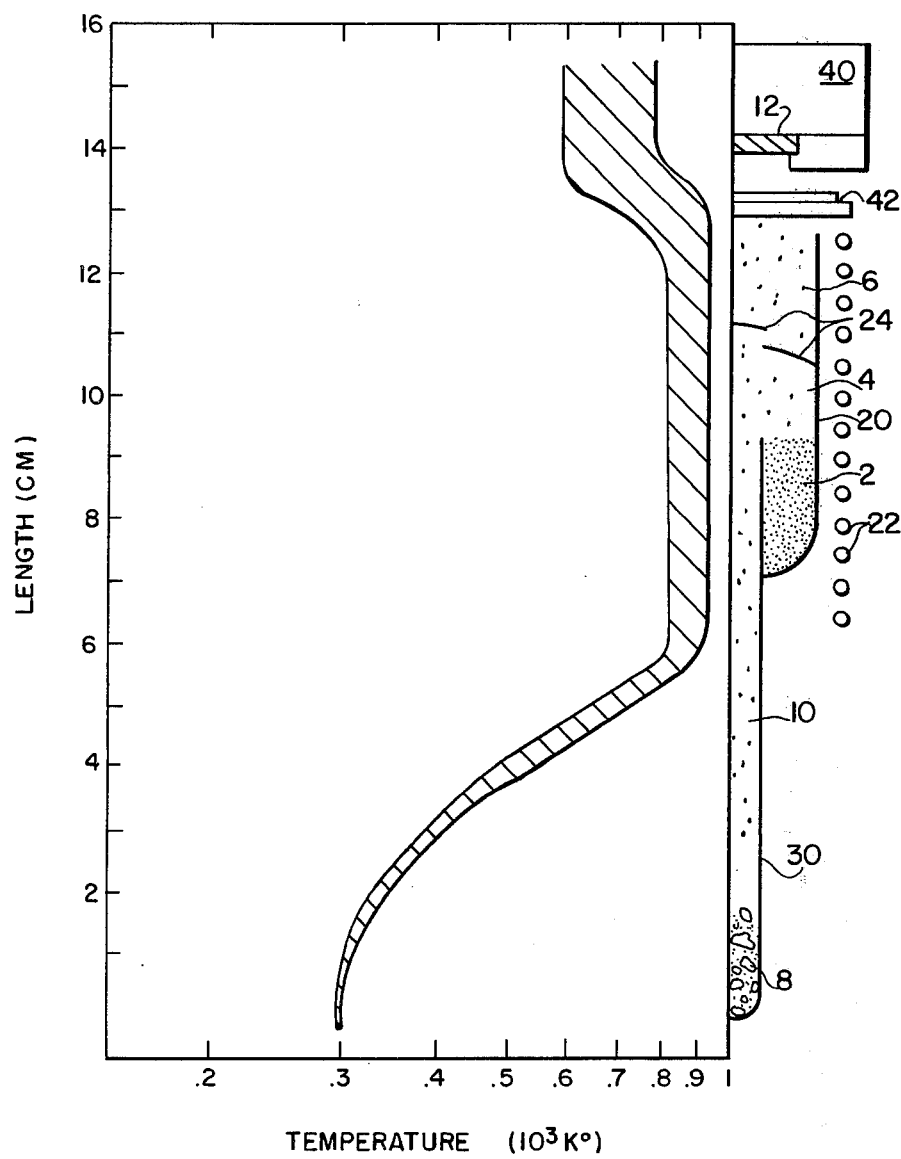
FIG. 2 is a temperature profile during growth along the length of the apparatus shown in FIG. 1. A logrithmic temperature scale is arrayed along the abcissia.

Turning now to FIG. 2 of the drawings, a vertical operating temperature profile of of the two temperature zone apparatus of FIG. 1 is set forth in rectangular coordinates for preparation of a $PbS_xSe_{1-x}$ film. A logarithm temperature scale from approximately room temperature through one thousand degrees Kelvin is arranged along the abscissa, and a half profile of part of the apparatus is arranged along the right ordinate with a linear scale in centimeters along the left ordinate. As shown, the operating temperature inside the apparatus varies from 300° K. (26° C.,±5°), through the sulfur dopant charge 8, to the 820° to 925° K. (550° to 650° C.) range through the metal alloy charge, to the 598° to 790° K. (325° to 510° C.) range at the substrates 12. With chamber 56 evacuated to a pressure below $10^{-6}$ Torr and dopant charge 8 at room temperature, the vapor pressure in the primary furnace is controlled by the vapor temperature of the sulfur dopant charge, approximately $2 \times 10^{-4}$ Torr. Thermodynamic equilibrium may be defined (by ignoring the Gibbs function) as a condition in which an isothermal profile exists throughout the length of the growth chamber of the apparatus. The deviation of the profile shown in FIG. 2 from an isothermal, assures vapor transport of molecules 6 as well as their condensation upon substrates 12. The necessity of maintaining the temperatures of only two areas of the growth chamber—the main furnace charge 2 and the substrates 12—within specific ranges provides the simplicity of this near equilibrium growth technique and its associated apparatus.

Once the selected operating pressure and temperatures are reached, sublimation of the source charges 2, 8 occurs, shutter mechanism 42 is opened, and those molecular particles 4 and 10 rising past baffle 24 (i.e., molecular particles 6) condense upon the exposed surface of each substrate 12. Baffle 24 is so placed that the larger of particles 4, 10 cannot pass, and that no particle can travel from a source charge 2, 8 to substrate 12 in a straight line. Without baffle 24, large particles would quickly rise through chimney 26, travel to the surface of substrate 12, and either stick and shadow the adjacent surface area, thereby causing pin-holes in the epilayer or, hit and richochet from the surface, thereby possibly fracturing epilayer 14. Some particles 6 pass through port 44 and condense upon the crystal face 62 of thickness monitor 60. This condensation decreases the resonant frequency of piezoelectric crystal 62, thereby enabling the amount and rate of growth of the epilayer on nearby substrate 12 to be accurately observed. When an epilayer 14 of the desired thickness is grown, shutter 42 is closed, substrate and furnace heaters are shut off, and atmospheric pressure is restored to the chamber.

Figure 3:
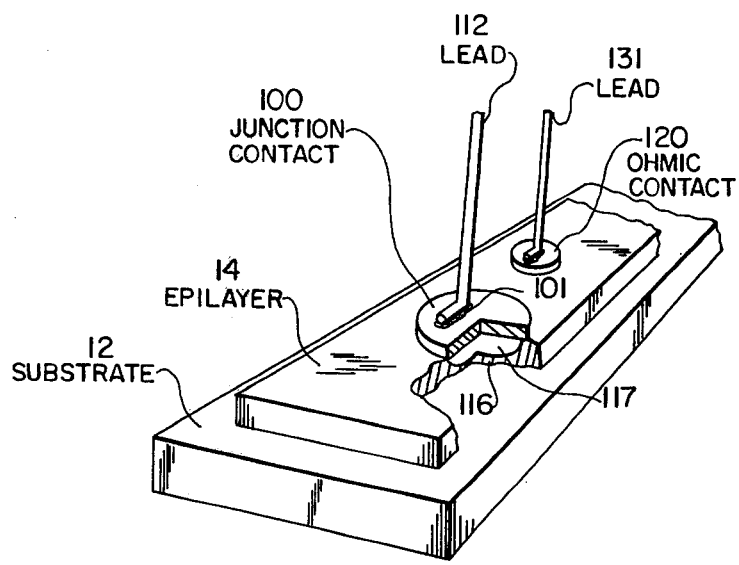
FIG. 3 is an orthogonal projection of a photovoltaic detector prepared according to the equilibrium growth technique.
Figure 3:

After cooling, the lead chalcogenide epilayer 14, as shown in FIG. 3, is removed from vacuum chamber 54, and a Schottky barrier planar junction 116 is formed by vacuum depositing on the exposed face of film 14 through a stainless steel mask either a central dot or strip of metal (e.g., indium, bismuth, lead or tin) 100. The as-grown film was vacuum annealed at 170° C. for thirty minutes, and then cooled to room temperature prior to depositing lead barriers. This step desorbed oxygen from the air exposed surface and was taken to assure production of a stable device. None of the samples were surface passivated in the following Examples. In one experiment, the mask was a narrow array of circular openings with areas of $3.2 \times 10^{-2}$ cm center spacing. The metal dot 100 inverts the semiconductor and converts part of the underlying volume of epilayer 14 into a region 117 of a second type conductivity opposite to the coductivity of epilayer 14. The deposited metal dot 100 serves as an electrical contact on which an electrical lead 112 to an external circuit may be attached with lead solder, or gold or silver paint 101. A thin metallic layer (e.g., gold or platinum) is deposited elsewhere on the exposed face of epilayer 14 to form an ohmic electrode 120. An ohmic electrode is one that supplies a reservoir of charge carriers that are freely available to enter epilayer 14 as needed. An electrical lead 131 may be attached to electrode 120. Typically, the impingent radiation 1 passes through substrate 12 and enters epilayer 14 within a single diffusion length of the area of planar junction 117 projected upon the common substrate 12—epilayer 14 surface. The material chosen for substrate 12 must be transparent to the wavelengths of interest. $BaF_2$ becomes opaque at approximately 14 microns; KBr at approximately 37 microns; and SrF$_2$ at an intermediate wavelength. By depositing a very thin (e.g., on the order of 100Å) layer of metal to form electrical contact 100, the contact will be transparent in the near, intermediate and far infrared bands, and the detector may be displayed to allow impingent radiation 1 to enter epilayer 14 without first passing through substrate 12.

The general nature of the invention having been set forth, the following illustrative examples are presented as typical embodiments thereof. It will be understood that the invention is not limited to these examples, but is susceptible to various modifications that will be recognized by one of ordinary skill in the arts. The true values of the charge carrier mobilities given in the examples are obtained after taking the oxidized surface layer into account by the Petritz two layer analysis, as set forth in "Surface Charge Transport In PbS$_x$Se$_{1-x}$ and Pb$_{1-y}$Sn$_y$Se Epitaxial Films", by J. D. Jensen and R. B. Schoolar, Journal of Vacuum Science Technology, Vol. 13, No. 4, 1976.

EXAMPLE I

The apparatus shown in FIG. 1 has been used to deposit epitaxial films of PbS$_x$Se$_{1-x}$ ($0 \leq x \leq 1$) on freshly cleaved (111) BaF$_2$. Deposition pressures and substrate temperatures were on the order of $10^{-6}$ Torr (i.e., $1.3 \times 10^{-4}$ Pa) and 350°–400° C., respectively. The main furnace 20 was maintained at 600° C. Growth rates were in the range of two to four microns per hour. The distance between source 2 and substrate 12 was four centimeters, and primary furnace 20 was two centimeters in diameter. Approximately twenty grams of granulated, slightly lead rich PbSSe source material 2 was placed in the upper furnace 20. This was a charge of material sufficient to obtain fifteen to twenty films of constant composition. The coaxial auxiliary or secondary, furnace 30 was charged with a small amount of pure sulfur 8 during the growth of PbS$_x$Se$_{1-x}$ ($0.5 \leq x \leq 1$) films. The sulfur source was needed to obtain nearly stoichiometric, p-type conductivity films. When down to pressure, the substrate heater was turned on and allowed to come to a steady state temperature between 325° and 510° C., the sublimation temperature of the source material. The primary oven in then heated to between 600° and 650° C., and the films were deposited onto the BaF$_2$ substrates. The films were cooled to room temperature, exposed to atmosphere and placed into a second evaporator for depositing lead Schottky barriers. Prior to depositing the barriers, the films were vacuum annealed at 170° C. for 30 minutes, and cooled to room temperature. The films were exposed to the atmosphere and inserted into a third vacuum system in which gold contacts were deposited at the centers of the lead contacts and fine gold wires were attached with silver epoxy. The gold pads which were used for the resistivity and Hall coefficient measurements served as the ohmic contacts for the detector measurements. The detector samples were then mounted in an optical dewer with a twenty degree field-of-view and three Schottky barriers on each film were evaluated. It should be noted that exposure of the fresh films to the atmosphere without passivation causes oxidation of their surfaces and a concomitant reduction in their electrical characteristics.

Transport properties for eight samples of PbS$_x$Se$_{1-x}$ with x varying between zero and one, at 77° K., are set forth in Table 1.

Figure 4:
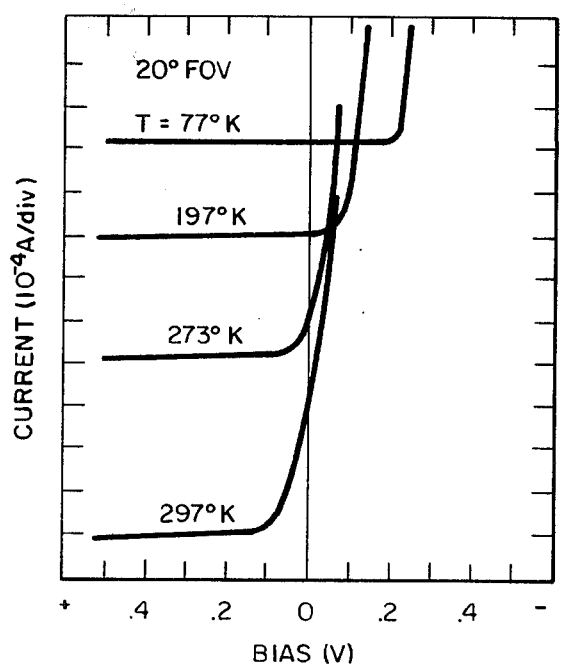
FIG. 4 is a graph illustrating the current-voltage characteristics of a lead Schottky barrier on PbS.
Figure 5A:
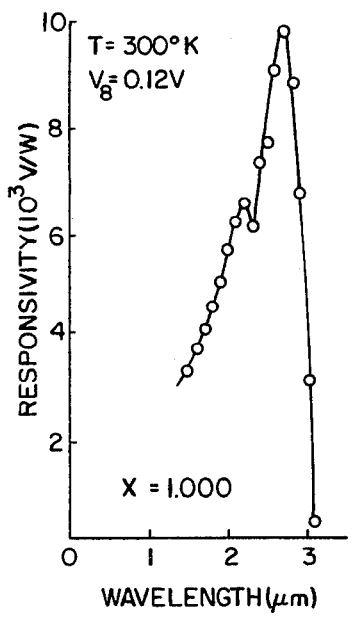
FIGS. 5A through 5G are graphs of the responsivity at 77° K., 195° K., and 300° K. for P-type $PbS_xSe_{1-x}$ films.
Figure 5B:
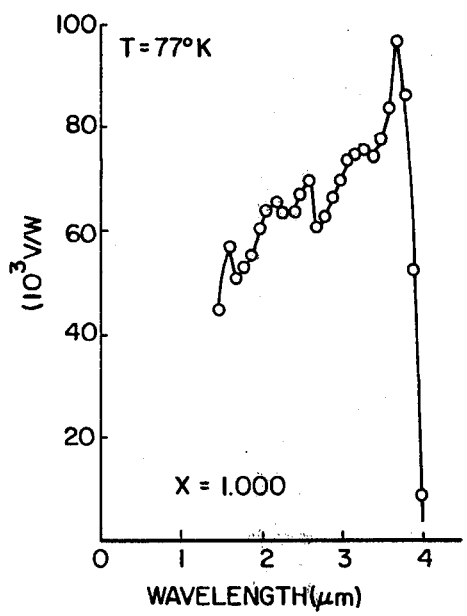
Figure 5C:
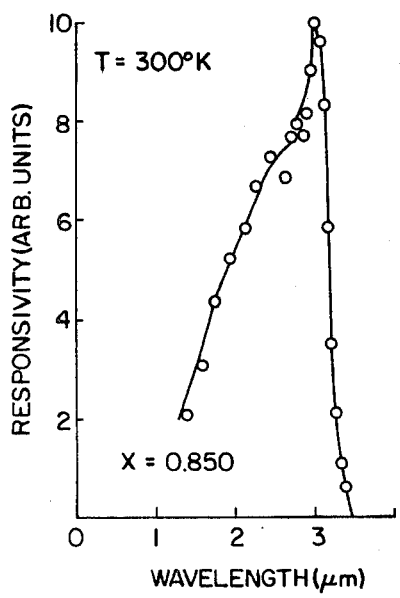
Figure 5D:
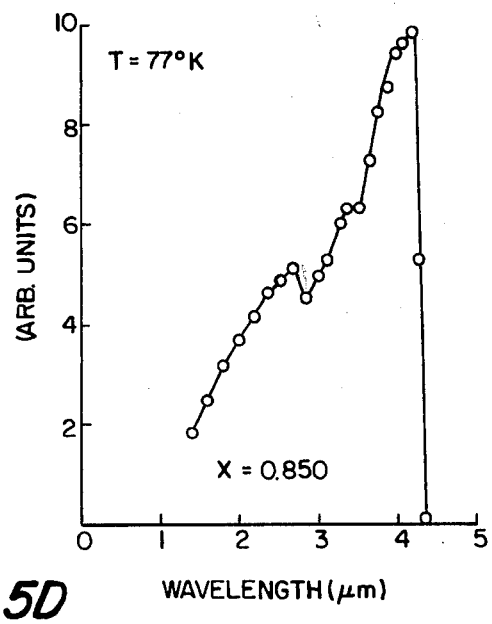
Figure 5E:
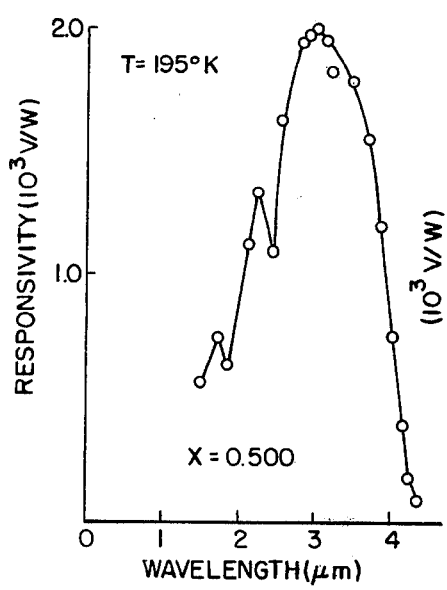
Figure 5F:
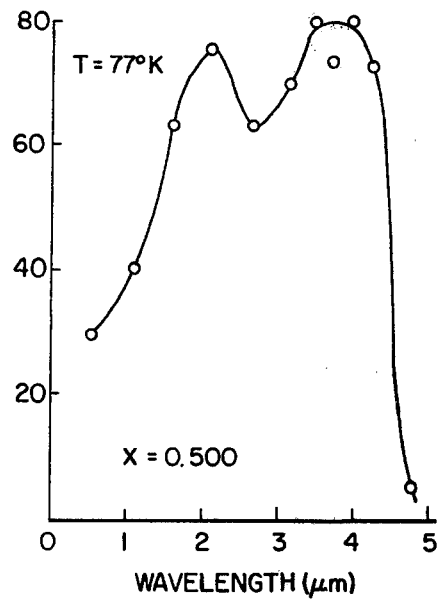
Figure 5G:
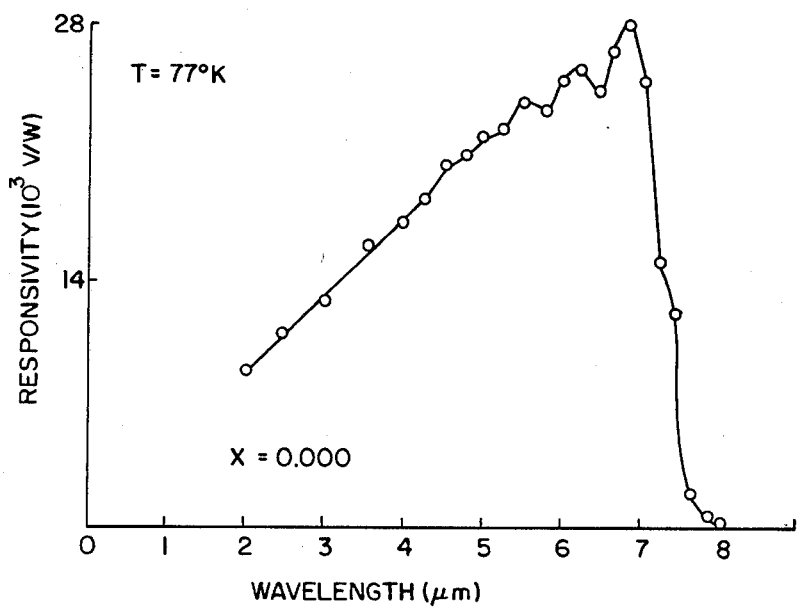

The I-V curves of a PbS Schottky barrier are shown in FIG. 4 for four different temperatures. Each curve is translated two divisions along the current axis for clarity. At room temperature, the resistance—area product of the barrier was very large when a reverse bias of 0.15 volts was applied. The RA product for zero bias was $2.1 \times 10^4$ ohms/cm$^2$ at 77° K.

The spectral responsivities of four unfiltered PbSSe Schottky barriers are shown in FIGS. 5A through 5G. The measurements were made with a 510 Hz modulation frequency. All four samples had broad response curves with sharp-cut-offs at wavelengths corresponding to the energy gaps of the alloys.

TABLE I

| x | d (μm) | $E_g$ | $N_p \cdot 10^{17}$ (cm$^{-3}$) | $\mu_p$(cm$^2$/Vs) | $L_N$ (cm $\cdot 10^{-4}$) | $\tau_N$(ns) |
|---|---|---|---|---|---|---|
| 0.0 | 4.6 |  | 3.1 | 26,000 | — | — |
| 0.0 | 6.1 | .175 | 3.1 | 26,000 | >6.1 | >2.2 |
| 0.5 | 4.5 |  | 0.5 | 4,700 | — | — |
| 0.5 | 3.6 | .242 | 1.8 | 3,300 | >3.6 | >6.0 |
| 0.8 | 3.2 |  | 1.2 | 7,900 | — | — |
| 0.85 | 5.8 | .294 | 0.6 | 7,000 | 5.0 | 5.4 |
| 1.00 | 8.5 |  | 3.3 | 10,000 | — | — |
| 1.00 | 2.4 | .305 | 2.8 | 8,000 | >2.4 | >1.0 |

The shape of these curves indicates that the PbSSe detectors were responding as ideal quantum counters with very little self-absorption in the films. Peak detectivities were just below those of background limited infrared photodetectors at 77° K. Photovoltaic detectors made from PbS$_x$Se$_{1-x}$ epilayers prepared according to the equilibrium growth technique are suitable for room temperature operation. Lower modulation frequencies will yield higher responsivities.

EXAMPLE II

Several epitaxial films of Pb$_{1-y}$Sn$_y$Se ($0 \leq y \leq 1$) on freshly cleaved (111) BaF$_2$ were prepared using the apparatus shown in FIG. 1, although the auxiliary coaxial furnance 30 was idle, with the pressure and temperature ranges set forth in Example I. The upper primary furnace was charged with approximately twenty grams of Pb$_{1-y}$Sn$_y$Se ($0 \leq y \leq 0.07$). Stoichiometry was controlled by the ingot composition of source charge 2, from which the films were grown. A 0.5% metal-rich source charge 2 yielded N-type films while a nearly stoichiometric ingot yielded P-type samples of low carrier density.

Transport properties for eight sample films at 77° K., the second having a N-type and the third a P-type conductivity, are set forth in Table 2.

TABLE 2

| y | d(μm) | $E_g$ | $N_p \cdot 10^{17}$ (cm$^{-3}$) | $\mu_p$(cm$^2$/Vs) | $L_n$ (cm $\cdot 10^{-4}$) | $\tau_N$ (ns) |
|---|---|---|---|---|---|---|
| 0.920 | 4.2 | 0.098 | 1.0 | 20,000 | 3.3 | 0.8 |
| 0.930 | 8.4 | 0.108 | 4.6 | 39,000 | — | — |
| 0.930 | 10.3 | 0.108 | 1.0 | 20,000 | — | — |
| 0.935 | 6.7 | 0.112 | 1.6 | 22,000 | 4.0 | 1.1 |
| 0.935 | 11.0 | 0.112 | 1.1 | 18,000 | 5.0 | 2.1 |
| 0.940 | 10.2 | .116 | 1.1 | 22,000 | 7.2 | 3.6 |
| 0.942 | 3.9 | .118 | 1.0 | 16,000 | 3.5 | 1.2 |
| 0.946 | 6.3 | .122 | 1.5 | 21,000 | 4.5 | 1.5 |

Figure 6:
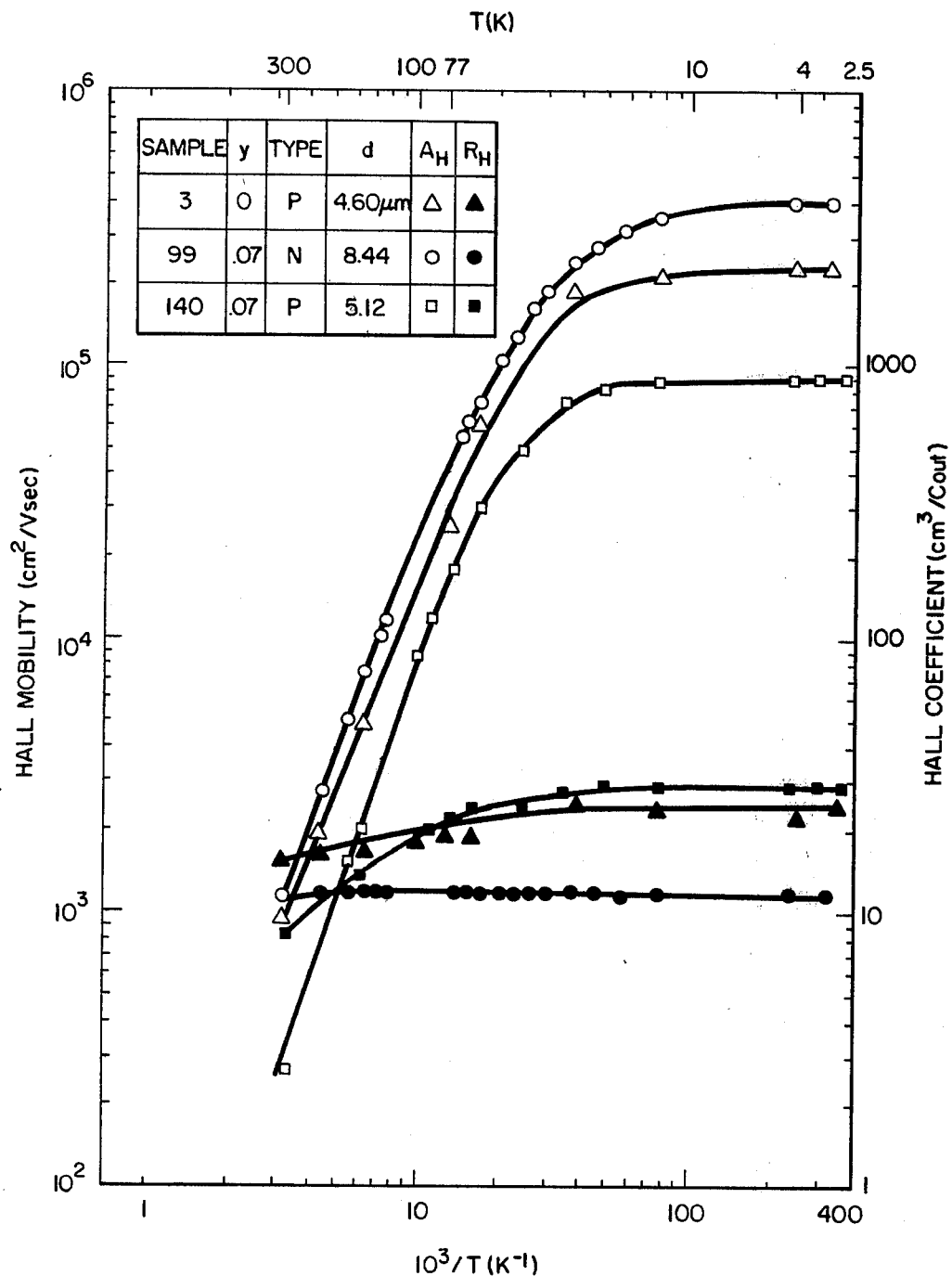
FIG. 6 is an orthogonal graph showing measured values for the Hall coefficient and Hall mobility at 77° K. for three $Pb_{1-y}Sn_ySe$, films as a function of ambient temperature.

Selected samples were measured down to liquid helium temperatures as a check on the quality of the films. The Hall coefficient and Hall mobility from 4.2° to 300° K. are shown in FIG. 6 for several as-grown PbSe and Pb$_{0.93}$Sn$_{0.07}$Se epitaial layers. The temperature dependence of the mobility compares very well with the highest values reported in the literature. The mobility follows $T^{-5/2}$ very closely between 100° and 300° K. and becomes temperature independent below approximately 20° K. This departure from $T^{-5/2}$ is consistent with estimates of size effects, assuming diffuse scattering from one surface and a mean free path of 6.4 μm. Nevertheless, the maximum mobility of $4 \times 10^5$ cm$^2$/V-s is the highest mobility observed for Pb$_{0.93}$Sn$_{07}$Se. A correction factor for size effects would increase the real mobility of sample 99 to $1.8 \times 10^6$ cm$^2$/V-s, provided that other scattering mechanisms are negligible. The maximum mobility for the P-type PbSnSe sample is down a factor of four from the mobility of the N-type sample. This is consistent with the transport properites of pure PbSe which has a higher electron mobility. The Hall coefficient is essentially temperature independent in agreement with the measurements of Allgaier and Scanlon. The Hall coefficient of sample 140 shows some temperature dependence above 50° K. indicating that the sample may be going intrinsic.

Figure 7:
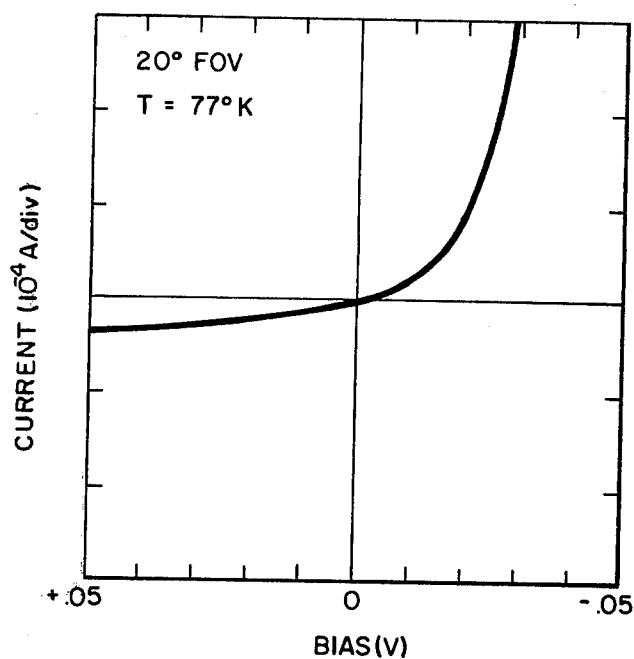
FIG. 7 is an orthogonal graph illustrating the current-voltage characteristics of a lead Schottky barrier on $Pb_{1-y}Sn_ySe$, y=0.065.

The I-V curve of a Pb$_{0.935}$Sn$_{0.065}$Se Schottky barrier at 77° K. is shown in FIG. 7. The zero-bias RA product was 2.0 ohms/cm$^2$ which compares very well with the values for similar devices produced by other means reported by Hohnke, Holloway, Young, and Hurley in Applied Physics Letters, Vol. 29, p. 98 (1976).

The spectral responsivities of six PbSnSe Schottky barrier samples are shown in FIGS. 8A through 8F. The responsivity of the PbSe sample shown in the figure corresponds to that of an ideal quantum counter and shows no evidence of peaking due to self absorption. All of the other alloys showed some degree of peaking which was strongest in the thickest samples. The peak responsivities decreased as the SnSe content increased and the energy gap decreased. This was primarily due to a decrease in the zero-bias RA product as the energy gap became smaller. The solid curves in FIGS. 8A through 8F were calculated using a model for self filtering detectors. Peak detectivities of these devices were close to those of background limited infrared photodetectors at 77° K.

The foregoing detailed discussion describes an equilibrium growth technique for preparing device quality, Schottky barrier photovoltaic detectors with a single-phase, lead-chalcogenide epilayer. The technique allows the energy gap of the epilayer to be varied by changing the composition of the PbS$_x$Se$_{1-x}$ alloy charge, thereby providing a process for preparing composition tuned detectors within the three to seven micron bandwidth. Similarily, varying the composition of a Pb$_{1-y}$Sn$_y$Se alloy charge allows preparation of composition tuned detectors within the 7 to 30 micron bandwidth.

Figure 9:
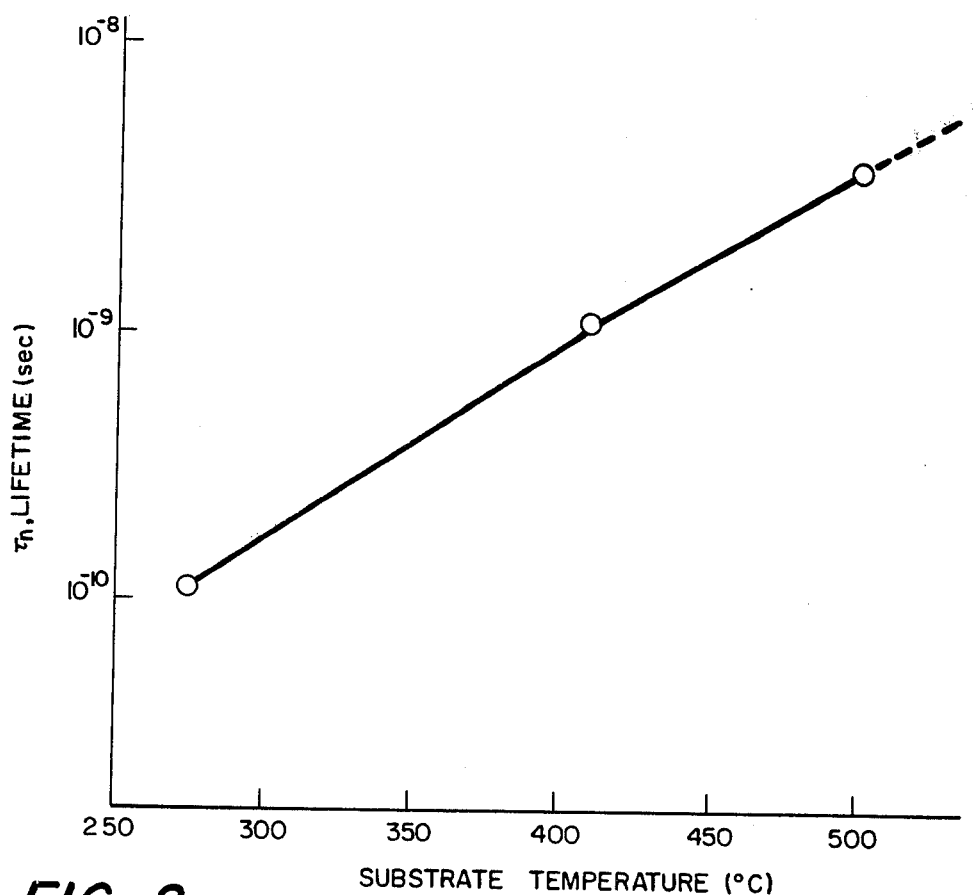
FIG. 9 is an orthogonal graph showing the dependence of the minority charge carriers lifetime at 300° K. as a function of the substrate temperature during growth.
Figure 8A:
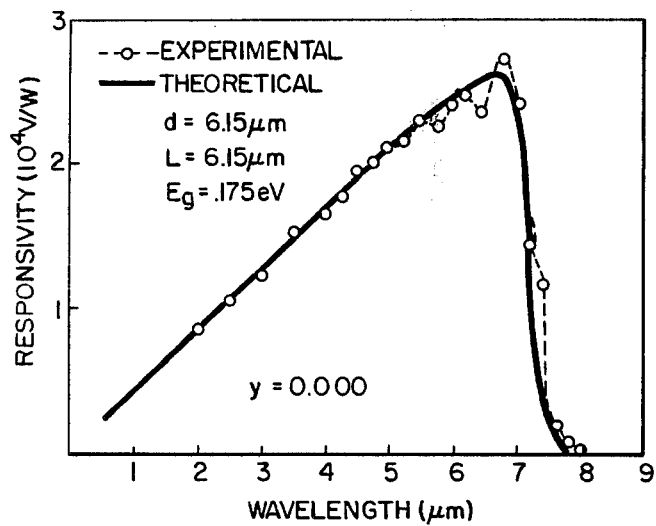
FIGS. 8A through 8F are orthogonal graphs illustrating the theoretical (solid curves) and experimental (dashed curves) responsivities of lead Schottky barriers on $Pb_{1-y}Sn_ySe$ epitaxial films at 77° K.
Figure 8B:
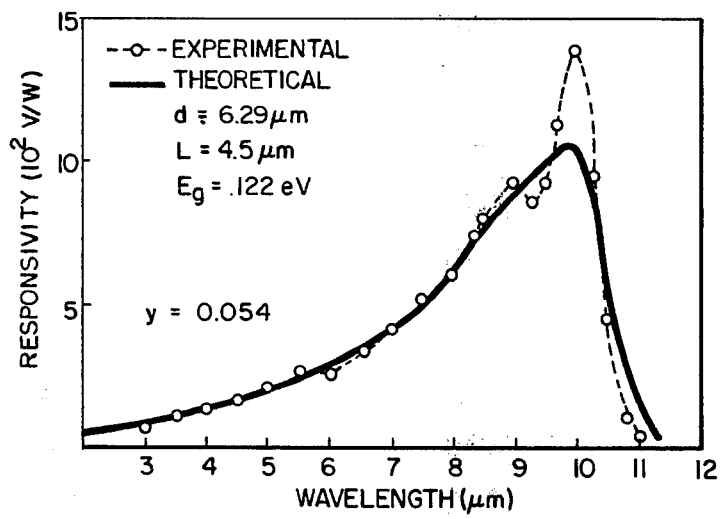
Figure 8C:
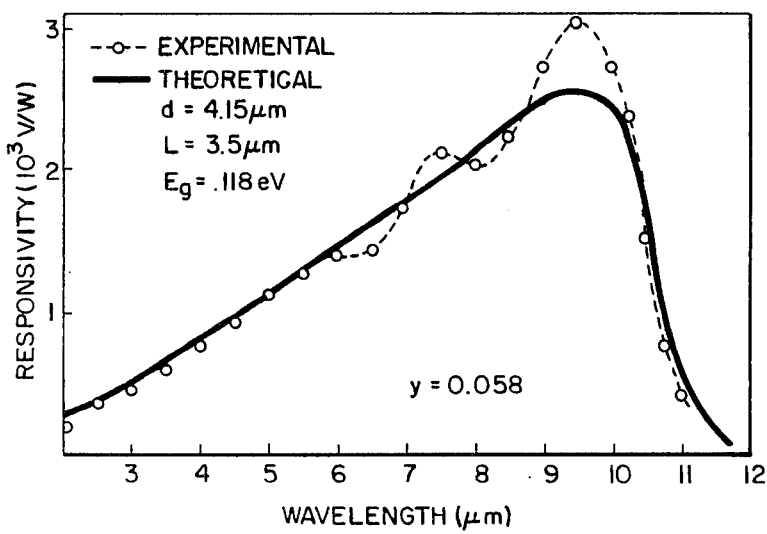
Figure 8D:
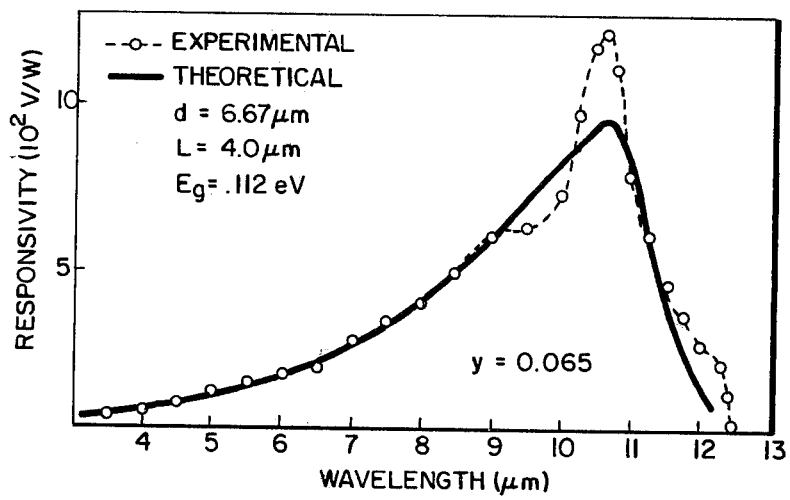
Figure 8E:
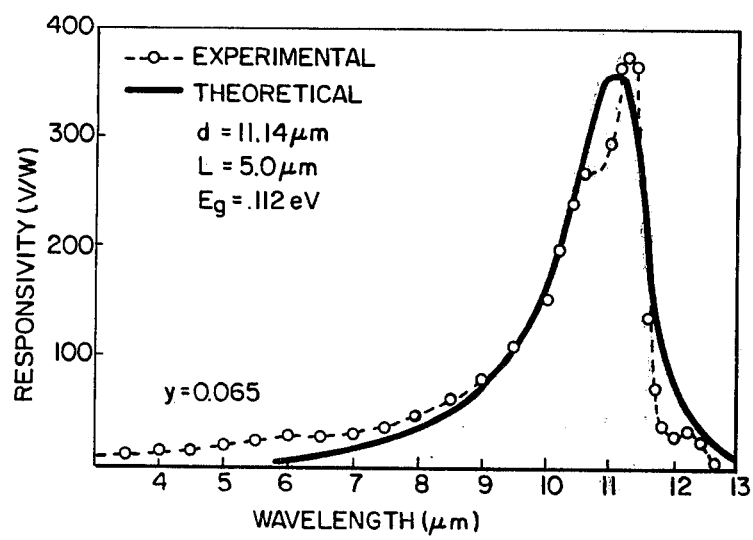
Figure 8F:
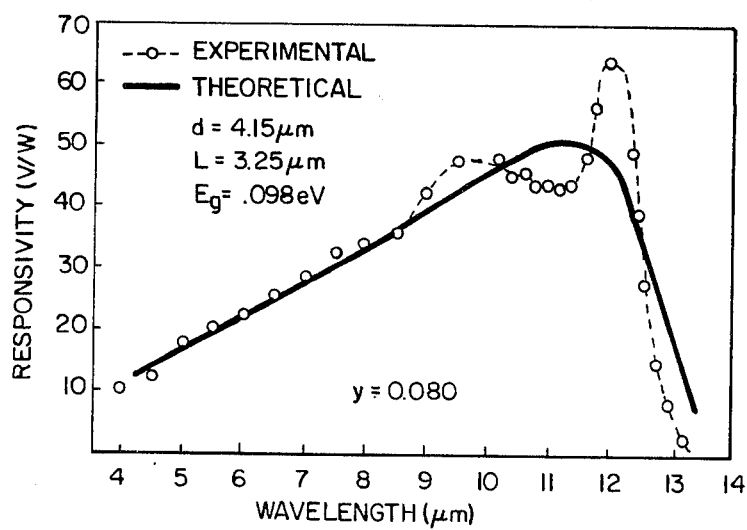

In addition, the minority charge carrier lifetimes of epilayers prepared under the teachings of the present process are lengthened and the number of crystal defects reduced, by maintaining an elevated substrate temperature during growth, thereby allowing for room temperature operation of the detectors prepared from the epilayers. Turning now to FIG. 9, a graph shows increasing substrate temperature along the abscissa plotted against increasing minority charge carrier lifetime along the ordinate. As shown, a substrate temperature greater than approximately 400° C. during growth will result in minority charge carrier lifetimes longer than one nanosecond at room temperature (i.e., 26° C.±5°) for those epilayers having a spectral response cut off at approximately three microns. Those epilayers prepared from materials having a spectral response between approximately four and ten microns must be cooled during operation to increasingly lower temperatures in order to have one nanosecond minority charge carrier lifetimes, while epilayers with spectral response cut off wavelengths between ten and twelve microns must be cooled (with liquid nitrogen) to approximately 77° K. in order to attain the same carrier lifetimes.

Obviously, the presently disclosed process may be practiced with several modifications. For example, selenium could be substituted for the sulfur dopant charge. Since selenium has a much lower vapor pressure, the "cold tip" 30 would have to be heated to approximately 130° C. to obtain single-phase films. Higher tip temperatures would produce P-type films and lower tip temperatures would yield N-type layers. Similarly, tellurium could be used as a dopant charge. Furthermore, this technique provides a method to prepare either single or multiple planar junction devices. By periodically varying the temperature of the chalcogenide contents in cold tip 8 from below to, or above, its sublimation temperature, the partial pressure of the chalcogenide vapor in uniformly mixed molecular particles 6 will increase, resulting in a change in the conductivity of the subsequent thickness of the film. If alloy charge 2 is slightly metal rich and during the initial growth of epilayer 14 the temperature of the chalcogenide 8 in cold tip 30 is kept below the sublimation temperature of the chalcogenide, the first growth will exhibit a N-type conductivity. If the temperature of chalcogenide is raised to, or above, the sublimation temperature of chalcogenide, the subsequent growth of epilayer 14 will exhibit a P-type conductivity. Returning the temperature of chalcogenide 8 to below its sublimation temperature will cause the next growth to exhibit N-type conductivity. As the process assures a uniform mixture of the vapors from metal alloy 2 and chalcogenide 8, and thus growth of uniform stoichiometry, successive layers will clearly define a planar P-N junction. In review of the foregoing discussion of the illustrative embodiments, it may be noted that the effective minority carrier diffusion lengths L$_N$ and effective lifetime $\tau_N$ can be calculated from analysis of the responsivities of the Schottky barriers using a technique described in the Applied Physics Letters, Vol. 16, 446 (1970). It can be shown that the average R$_\lambda$ of a back-illuminated Schottky barrier on a film of thickness d, neglecting surface recombination, is given by:

$$R_\lambda = \left(\frac{\eta q Z}{E_\lambda}\right) = \quad (1)$$

$$\{ [(1-R)e^{-\alpha(d-L_N)} [1-e^{-2\alpha L_N}] ] \cdot [qZ/E_\lambda] \}$$

where
  η is the external quantum efficiency;
  q is the unit of electronic charge;
  Z is the sample and preamp impedance;
  E$_\lambda$ is the photon energy; and,
  R is the reflection loss at the BaF$_2$—sample interface.
The coefficient R was calculated using the relation;

$$R = \left(\frac{n_s - n_B}{n_s + n_B}\right)^2 \quad (2)$$

where $n_s$ and $n_B$ are the refractive indices of the film and substrate, respectively. The reflection coefficient at the film-barrier metal interface is very high and was assumed to equal unity in order to simplify Eq. (1). The coefficient $\alpha$ has been measured for PbS as a function of temperature and at 90° K. is given by:

$$\alpha = 2.5 \times 10^4 (E-E_g)^{1/2} \quad E > E_g + 0.001 \text{ (eV) and,} \quad (3)$$

$$\alpha = 830 \exp 286 (E-E_G) \quad E < E_g + 0.001 \text{ (eV)} \quad (4)$$

where E and $E_g$ are in units of electron-volts.

These relations are used for all calculations since the optical constants of the other lead salts have not been measured at 77° K., but are known to have a similar energy dependency at room temperature. Theoretical models do not include the exponential tails observed in the absorption edges of these semiconductors.

The solid curves in FIGS. 8A-8F were calculated using Eq. (1, 2, and 3) and adjusting $E_g$ and $L_N$ to achieve the best fit to the shapes of the responsivity curves. The quantitative agreement was also good. The fit to the PbSe sample shown in FIG. 8A was remarkably good and yielded the accepted value of 0.175 eV for $E_g$ at 77° K. The discrepencies between the experimental and calculated curves were due primarily to optical interference effects not included in Eq. (1). The values obtained for $L_N$ are listed in Table I. Only lower limits were obtained when $L_N$ was equal to the sample thickness.

The effective minority carrier lifetime $\tau_N$ was calculated using the well known relation for carrier diffusion given by:

$$\tau_N = \left( \frac{qL_N^2}{KT\mu_N} \right) \quad (5)$$

where
K is Boltzmann's constant;
T is Temperature; and
$\mu_N$ is the minority carrier mobility.

Figure 10:
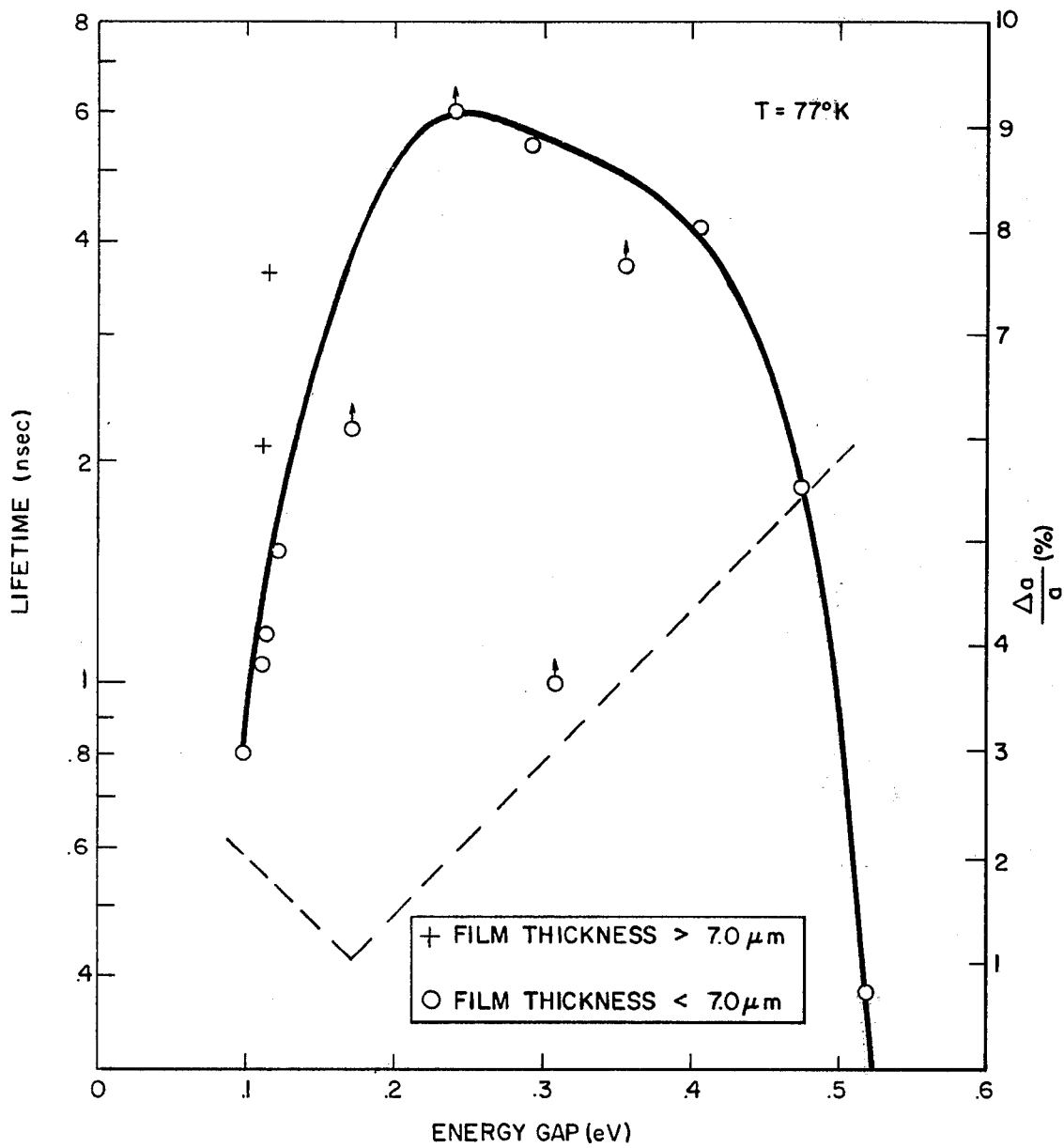
FIG. 10 is an orthogonal graph illustrating the minority charge carrier lifetime (solid curve) and lattice mismatch (dashed curve) as a function of the energy gap in lead salt alloy epitaxial films.

The measured Hall mobilities are used in the calculations since the mobility ratio is close to unity in the lead salts. The calculated values of $\tau_N$ are shown in FIG. 10 as a function of the energy gap, $E_g$. The points with arrows represent lower limits and were computed for samples where $L_N > d$. The lifetimes reached a maximum value somewhere in the vacinity of $E_g = 0.175$ eV corresponding to the PbSe compound. This may be due to a lower density of misfit dislocations in the PbSe films since the lattice mismatch to BaF$_2$ is 1.3% and becomes larger in both alloys. The mismatch between the lattice constant of the films and the lattice constant of their BaF$_2$ substrates is plotted by the dashed line in FIG. 10 as a function of the energy gap of the film material. The lattice mismatch, $\Delta a/a$, is shown by a scale along the right ordinate in units varying between one and ten percent. It may be possible to make significant increases in $\tau_N$ by growing the films on lattice matched Ba$_z$Sr$_{1-z}$F$_2$ substrates. While pure SrF$_2$ has a lattice constant lower than both IV—VI alloys, pure BaF$_2$ has a larger lattice constant. Accordingly, the lattice constants of Ba$_z$Sr$_{1-z}$F$_2$ substrates can be matched perfectly to both IV—VI alloys. It should be noted in FIG. 10 that the two thickest Pb$_{0.93}$Sn$_{0.07}$Se samples have longer lifetimes than thinner samples of similar composition. This may be due to a reduction in misfit dislocations as the films get thicker.

What is claimed is:

1. A process for preparing epitaxial films of constant stoichiometry of a semiconducting material selected from the group consisting of lead salts and lead tin salts, deposited upon an insulating crystalline substrate in a vacuum of at least $10^{-4}$ Torr, comprising simultaneously.

maintaining the substrate at a temperature greater than 350° C. and below the sublimation temperature of the material;
   maintaining the material at a temperature greater than its sublimation temperature;
   maintaining a source of a substance capable of altering the stoichiometry of the films at the sublimation temperature of the substance; and then,
   exposing the substrate to a homogeneous mixture of vapor of the material and the substance until an epitaxial film of constant stoichiometry is deposited upon the substrate.

2. The process set forth in claim 1 further comprising the atomic fraction x varying between zero and one, inclusive, and the atomic fraction y varying between zero and one, inclusive.

3. The process set forth in claim 1 further comprised of exposing the substrate to the homogeneous mixture of vapor until an epitaxial film of smooth stoichiometry and uniform conductivity is deposited upon the substrate.

4. The process set forth in claim 1 further comprised of maintaining the substrate at a temperature greater than 370° C.

5. The process set forth in claim 1 further comprised of maintaining the substrate at a temperature near 500° C.

6. The process set forth in claim 3 wherein said substance is selected from the group consisting of sulfur selenium, or telluride.

7. The process set forth in claim 6 wherein said material is maintained at a temperature between 550° and 650° C.

8. The process set forth in claim 1 wherein the insulating crystalline substrate is an alloy of Ba$_z$Sr$_{1-z}$F$_2$.

9. The process set forth in claim 8 further comprising: varying the atomic fraction z between zero and one, inclusive.

10. A process for preparing epitaxial films of a semiconducting material selected from the group consisting of lead salts and lead tin salts, being deposited upon an insulating crystalline substrate in a vacuum of at least $10^{-4}$ Torr, comprising simultaneously:

maintaining the substrate of an alkali-halide at a temperature between 350° C. and the sublimation temperature of the material;
    maintaining the material in a primary chamber of a two chamber furnace at a temperature between 350° C. and the sublimation temperature of the material;
    maintaining a source of a dopant selected from the group consisting of sulfur, selenium, tellurium, or mixtures thereof, in a secondary chamber of the furnace discharging into the primary chamber, at the sublimation temperature of the dopant; and then,
    exposing the substrate to a homogeneous mixture of vapor of the material and the dopant until an epitaxial film having uniform stoichiometry across its width is deposited on the substrate.

11. A process for controlling the carrier concentration of epitaxial films of $PbS_xSe_{1-x}$, wherein x varies between zero and one, inclusive, being deposited upon a substrate in a vacuum of at least $10^{-4}$ Torr from a source of material maintained at a temperature above its sublimation temperature, comprising:
maintaining an insulating crystalline alkali-halide substrate at a temperature between 350° C. and the sublimation temperature of the material; and
exposing said substrate to a homogeneous mixture of vapor formed by subliming the material and a source of a substance capable of altering the stoichiometry of the films in the vacuum until an epitaxial film of constant stoichiometry across its width is deposited on the substrate.

12. The process set forth in claim 11 wherein the insulating crystalline substrate is $Ba_zSr_{1-z}F_2$, $0 \leq Z \leq 1$.

13. The process set forth in claim 12 further comprising selecting the atomic fraction "z" whereby the lattice constant of the substrate matches the lattice constant of the epitaxial film.

14. The process set forth in claim 13 further comprised of maintaining the source of material at a temperature between 550° C. and 650° C.

15. The process set forth in claim 14 wherein said dopant is selected from the group consisting of sulfur, selenium, and tellurium.

16. A process for influencing the minority charge carrier lifetime in an epitaxial film of a material selected from the group consisting of $PbS_xSe_{1-x}$ and $Pb_{1-y}Sn_ySe$, wherein x varies from zero to one, inclusive, and y varies from zero to one, inclusive, while depositing the film upon an insulating crystalline substrate, comprising simultaneously:
maintaining the substrate of an alkali-halide at a temperature above 350° C. and below the sublimation temperature of the material to be deposited in a vacuum of at least $10^{-5}$ Torr; and
exposing the substrate to a vent of a furnace emitting a homogeneous vapor of an all chemically reacted source of the material to be deposited, the source having about the same composition as that of the epitaxial film to be deposited and maintained in a primary chamber of the furnace at a temperature above its sublimation temperature, until an epitaxial film having uniform stoichiometry across its width is deposited on the substrate.

17. The process set forth in claim 16 wherein the source of material is maintained between 550° and 650° C.

18. The process set forth in claim 16 further comprising:
maintaining in a secondary chamber appended to the furnace and discharging into the primary chamber dopant capable of altering the stoichiometry of the film at the sublimation temperature of the dopant simultaneously with the steps of maintaining substrate at a temperature above 350° C.; and
exposing the substrate to a homogeneous vapor of the material and the dopant.

19. The process set forth in claim 16 wherein the insulating crystalline substrate is an alloy of $Ba_zSr_{1-z}F_2$, $0 \leq Z \leq 1$, further comprised of selecting the atomic fraction "z" whereby the lattice constant of the substrate matches the lattice constant of the epitaxial film.

20. The process set forth in claim 19 further comprised of:
exposing the substrate during growth of the film to a homogeneous vapor of the material and a charge of a dopant, the dopant being maintained at a temperature not less than the sublimation temperature of the dopant.

21. The process set forth in claim 20 further comprised of:
alternately maintaining the charge of the dopant at a temperature less than, and at a temperature greater than, the sublimation temperature of the dopant.

22. A process for influencing the minority charge carrier lifetime in an epitaxial film of $PbS_xSe_{1-x}$ wherein x varies between zero and one, inclusive, while depositing the film upon an insulating crystalline substrate, comprising simultaneously:
maintaining the substrate of an alkali-halide at a temperature greater than 350° C. and below the sublimation temperature of
$PbS_x$, $Se_{1-x}$ from which the epitaxial film is to be grown in a vacuum of at least $10^{-4}$ Torr; and
exposing the substrate to a homogeneous vapor from a furnace discharging through a single vent in which a source of $PbS_x$, $Se_{1-x}$, is maintained in a primary chamber of the furnace at a temperature above its sublimation temperature and a charge of a chalcogenide maintained at its sublimation temperature in a secondary chamber of the furnace that exhausts into the primary chamber below the vent, until an epitaxial film of $PbS_xSe_{1-x}$ where x is constant throughout the film, is deposited upon the substrate.

23. The process set forth in claim 22 wherein the temperature of the substrate is between 350° and 510° C.

24. The process set forth in claim 23 wherein the temperature of the $PbS_x$, $Se_{1-x}$ to be deposited in between 600° and 650° C.

25. The process as set forth in claim 24 wherein said chalcogenide is comprised of sulfur.

26. The process as set forth in claim 24 wherein said chalcogenide is comprised of selenium.

27. A process for depositing an epitaxial film of a material selected from the group consisting of lead salts and lead tin salts, upon an insulating crystalline substrate in a vacuum of at least $10^{-4}$ Torr, comprising simultaneously:
creating in one chamber of a furnace having a single vent spaced above an all chemically reacted source of the material a first vapor by maintaining the material above its sublimation temperature;
creating in another chamber of the furnace a second vapor by maintaining a source of a substance capable of altering the stoichiometry of the film near the sublimation temperature of the substance;
introducing the second vapor at a point below the vent into the one chamber;
maintaining the substrate of an alkali-halide at a temperature above 350° C. and below the sublimation temperature of the material;
creating a homogeneous mixture of the first and second vapors below the single vent; and then
exposing the substrate to the homogeneous mixture of the first and second vapors discharged from the vent until an epitaxial film with a constant stoichiometry is deposited upon the substrate.

28. The process set forth in claim 27 wherein the substrate is maintained at a temperature greater than 400° C.

29. The process set forth in claim 28 wherein the second vapor is introduced into the furnace coaxially with the first vapor whereby the substrate is subject to an uniform mixture of the first and second vapors.

30. The process set forth in claim 29 wherein the substrate is maintained at a temperature near 500° C.

31. The process set forth in claim 30 wherein the substance is selected from the group consisting of sulfur, selenium, or telluride.

32. The process set forth in claim 31 wherein the material is maintained at a temperature between 550° C. and 650° C.

33. The process set forth in claim 27 wherein the insulating crystalline substrate is an alloy of $Ba_zSr_{1-z}F_2$.

34. The process set forth in claim 33 further comprising:
varying the atomic function "z" between zero and one, inclusive.

35. The process set forth in claim 33 further comprising:
varying the atomic fraction "z" to obtain a match between the lattice constant of the substrate and the lattice constant of the film.

36. The process set fourth in claim 34 further comprising:
varying the atomic fraction "z" to obtain a match between the lattice constant of the substrate and the lattice constant of the film.

37. A process for preparing epitaxial films having constant stoichiometry and a first type conductivity, from a material selected from the group consisting of $[Pb]_a$ $[S_xS_{1-x}]_{1-a}$ and $[Pb_{1-y}Sn_y]_a[Se]_{1-a}$, $0 \leq x \leq 1$, $0 \leq y \leq 1$, deposited upon an insulating crystalline substrate in a vacuum of at least $10^{-4}$ Torr, comprising:
maintaining the substrate of an alkali-halide at a temperature above 350° C. and below the sublimation temperature of the material;
creating in a first chamber below a vent spaced above an all chemically reacted source of the material a first vapor by maintaining the material at a temperature above its sublimation temperature;
creating in a second chamber a second vapor by maintaining at its sublimation temperature a charge of a chalcogenide capable of altering the stoichiometry of the film; and
discharging the second vapor into the first chamber below the vent to form a homogeneous mixture of the first and second vapors below the vent;
discharging the homogeneous mixture through the vent; and
exposing the substrate to the homogeneous mixture discharged through the vent until a epitaxial film having constant stoichiometry throughout is deposited on the substrate.

38. A method for controlling the type of conductivity of an epitaxial film to be prepared by the process set forth in claim 37 comprising:
varying the atomic fraction "a" of the material.

39. The process set forth in claim 38 wherein atomic fraction "a" of the material equals $0.500 + 0.003\%$.

40. The process set forth in claim 39 wherein the distance between the vent and the substrate is less than two centimeters.

41. The process set forth in 39 wherein the temperature of the substrate is greater than 400° C. and the temperature of the material is between 550° C. and 650° C.

42. A method for controlling the type of conductivity of the films to be prepared by the process set forth in claim 41 when the material selected has a second and opposite type conductivity; comprising:
periodically decreasing the temperature of the charge to a value below the sublimation temperature of the chalcogenide while the substrate is exposed to the homogeneous mixture.

43. A process for preparing epitaxial films from a material selected in the group consisting of lead salts and lead tin salts, deposited upon an insulating crystalline substrate in a vacuum of at least $10^{-4}$ Torr, comprising:
maintaining between a source of the material and a substrate of an alkali-halide spaced thereabove, a thermal gradient varying from at least the sublimation temperature of the material at the source to between 350° C. and a value less than the sublimation temperature of the material at the substrate;
maintaining just above its sublimation temperature a source of a chalcogenide capable of altering the stoichiometry of the films, and,
exposing the substrate simultaneously to a homogeneous vapor from the sources of the material and the substance until an epitaxial film is deposited upon the substrate.

44. The process set forth in claim 43 wherein the temperature of the substrate is greater than 400° C.

45. A process for preparing multiple junction epitaxial films of a material selected from the group consisting of $PbS_xSe_{1-x}$ and $Pb_{1-y}Sn_ySe$, $0 \leq x \leq 1$, $0 \leq y \leq 1$, deposited upon an insulating crystalline substrate in a vacuum of at least $10^{-4}$ Torr, comprising:
maintaining the substrate of an alkali-halide at a temperature between 350° C. and the sublimation temperature of the material;
maintaining the material in a primary chamber of a furnace a temperature greater than its sublimation temperature;
periodically maintaining a source of a substance selected from the group consisting of sulfur, selenium, tellurium, or mixtures thereof at the sublimation temperature of the substance in a secondary chamber of the furnace discharging into the primary chamber below the vent to produce at the vent a homogeneous mixture of vapors from the material and the substance;
exposing the substrate to the homogeneous mixture until an epitaxial film is deposited upon the substrate.

46. A process for preparing an epitaxial film having alternate layers of opposite type conductivity, from a material selected from the group consisting of $Pb_a[X_xX'_{1-x}]_{1-a}$ and $[Pb_{1-y}Sn_y]_aX_{1-a}$ where X and X' are chalcogenides and $0 \leq x \leq 1$, $0 \leq y \leq 1$, deposited upon an insulating crystalline substrate in a vacuum of at least $10^{-4}$ Torr, comprising:
maintaining the substrate at a temperature above 350° C. and below the sublimation temperature of the material;
creating a first vapor below a chimney venting through an orifice spaced above an all chemically reacted source of the material maintained at a temperature above its sublimationg temperature;
exposing the substrate to the orifice to allow deposition expose the substrate of an epitaxial film; and periodically during deposition of the epitaxial film introducing a second vapor into the chimney at a point below the orifice by maintaining at its sublimation temperature a source of a substance capable of altering the stoichiometry of the film.

47. A method for controlling the type of conductivity of an epitaxial film to be prepared by the process set forth in claim 46 comprising:

varying the atomic fraction "a" of the material.

48. The process set forth in claim 47 wherein atomic fraction "a" of the material equals 0.500±0.003%.

49. The process set forth in claim 46, wherein said orifice comprises the upper apperture of a vertical primary furnace having a constant ratio of heated length to diameter along its length.

50. The process set forth in claim 46, wherein said orifice comprises the upper apperture of a vertical primary furnace having a single isotherm along its length.

51. The process set forth in claim 49 further comprising a temperature gradient extending along the length of said primary furnace between said source and said substrate, within the range of 14 to 254 centimeters per degree Celsius.

52. The process set forth in claim 49 further comprising a temperature gradient extending along the length of said primary furnace between said source and said substrate, within the range of 28 to 236 centimeters per degree Celsius.

53. The process set forth in claim 49 further comprising a temperature gradient extending between the lower extremeity of said primary furnace and said substrate of less than 163 centimeters per degree Celsius.

54. The process set forth in claim 49 further comprising a temperatuare gradient extending between the lower extremeity of said primary furnace and said substrate of less than 102 centimeters per degree Celsius.

55. The process set forth in claim 49 further comprising a temperature gradient extending between the lower extremity of said primary furnace and said substrate of less than thirty centimeters per degree Celsius.

56. The process set forth in claim 49 wherein the substance is within a vertical secondary furnace coaxially appendant on, and discharging above, the lower extremity of said primary furnace.

57. The process set forth in claim 56 further comprising an area-temperature gradient product between the lower extremity of said secondary furnace and the lower extremity of said primary furnace, within a range of 22 to 30 centimeters per degree Celsius.

58. The process set forth in claim 56 further comprising an area-temperature gradient product between the lower extremity of said secondary furnace and the lower extremity of said primary furnace of less than 28.6 centimeters per degree Celsius.

* * * * *